US010039179B2

(12) United States Patent
Matsuhashi (10) Patent No.: US 10,039,179 B2
(45) Date of Patent: Jul. 31, 2018

(54) WIRING SUBSTRATE

(71) Applicant: NGK SPARK PLUG CO., LTD., Nagoya-shi, Aichi (JP)

(72) Inventor: Kensuke Matsuhashi, Konan (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 24 days.

(21) Appl. No.: 15/350,262

(22) Filed: Nov. 14, 2016

(65) Prior Publication Data

US 2017/0142822 A1    May 18, 2017

(30) Foreign Application Priority Data

Nov. 17, 2015 (JP) ................... 2015-224787
Aug. 12, 2016 (JP) ................... 2016-158411

(51) Int. Cl.

| H05K 1/02 | (2006.01) |
| H05K 1/03 | (2006.01) |
| H05K 1/11 | (2006.01) |
| H01L 23/367 | (2006.01) |
| H01L 23/498 | (2006.01) |
| H05K 1/18 | (2006.01) |

(52) U.S. Cl.
CPC ....... *H05K 1/0204* (2013.01); *H01L 23/3675* (2013.01); *H01L 23/49822* (2013.01); *H01L 23/49827* (2013.01); *H01L 23/49838* (2013.01); *H05K 1/0271* (2013.01); *H05K 1/0306* (2013.01); *H05K 1/115* (2013.01); *H05K 1/18* (2013.01); *H05K 2201/10416* (2013.01)

(58) Field of Classification Search
CPC .... H05K 1/0204; H05K 1/0271; H05K 1/115; H05K 1/0306; H05K 2201/10416; H01L 23/49822; H01L 23/49838; H01L 23/49827; H01L 23/3675
See application file for complete search history.

(56) References Cited

U.S. PATENT DOCUMENTS 4,784,974 A * 11/1988 Butt .................. H01L 21/50
156/89.18
5,644,163 A * 7/1997 Tsuji .................. H01L 23/13
257/705

(Continued)

FOREIGN PATENT DOCUMENTS

JP    H07-77988 B2    8/1995
JP    H10-321759 A    12/1998

*Primary Examiner* — Ishwarbhai B Patel
(74) *Attorney, Agent, or Firm* — Stites & Harbison, PLLC; Jeffrey A. Haeberlin; James R. Hayne (57) ABSTRACT

A wiring substrate includes: a substrate body made from ceramic, having a front surface and a rear surface, and having a through hole penetrating between the front surface and the rear surface; and a heatsink inserted into the through hole. A step portion protruding in a direction perpendicular to an axial direction of the through hole, is formed over an entire periphery on an inner wall surface of the through hole of the substrate body. A flange opposed to the step portion is provided so as to protrude, over an entire periphery on a side surface of the heatsink. A stress relaxing ring is arranged over an entire periphery between the step portion and a joining surface opposed to the step portion. A brazing material is provided between the ring, and the joining surface and the step portion.

8 Claims, 5 Drawing Sheets

(56) References Cited

U.S. PATENT DOCUMENTS

| | | | |
|---|---|---|---|
| 5,856,911 A * | 1/1999 | Riley | G06F 1/203 |
| | | | 174/16.3 |
| 6,218,214 B1 * | 4/2001 | Panchou | H01L 22/00 |
| | | | 257/E21.521 |
| 6,295,200 B1 * | 9/2001 | Schmidt | H01L 21/4882 |
| | | | 165/185 |
| 7,038,311 B2 * | 5/2006 | Woodall | H01L 23/3677 |
| | | | 257/706 |

* cited by examiner

WIRING SUBSTRATE

CROSS REFERENCE TO RELATED APPLICATION

The present application claims priority to Japanese Patent Application Nos. 2015-224787 and 2016-158411 filed on Nov. 17, 2015 and Aug. 12, 2016, respectively, the disclosures of which are herein incorporated by reference in their entirety.

BACKGROUND OF THE INVENTION

Field of the Invention

The present invention relates to a wiring substrate in which a heatsink made from metal and for mounting an element having a comparatively great heat generation amount on the front surface thereof is inserted into a through hole penetrating between the front surface and the rear surface of the substrate body made from ceramic.

Description of Related Art

For example, a ceramic package with a heatsink is proposed in which a stress relaxing material made from a Cu-based metal and having, on the outer periphery thereof, a coat made from an alloy including one kind or two or more kinds of Pt, Pd, Rh, Ni, and Co is interposed between the ceramic package and the heatsink, and the ceramic package and the heatsink are joined by means of silver soldering or the like via the stress relaxing material (see, for example, Patent Document 1).

In FIG. 1 in the Patent Document 1, the ceramic package is formed by stacking, in a stepped manner, a plurality of ceramic layers having through holes at the center side in a plan view, and the heatsink is brazed via the stress relaxing material to the bottom surface side of the lowermost ceramic layer the through hole of which has the narrowest opening width. In this case, the mounting area on the surface of the heatsink is necessarily narrowed because of the opening width of the through hole in the lowermost ceramic layer. As a result, there is a problem that the size of an element such as an electronic component to be mounted later is restricted and the total number of elements to be mounted is limited.

Further, shrinkage stress occurring in the heatsink due to thermal shrinking after the brazing is transmitted to the adjacent ceramic layer via the entire thickness at the peripheral part on the outer peripheral side of the heatsink. Thus, there is also a problem that crack and peeling are likely to occur in the vicinity of the joining part of the brazed ceramic layer.

RELATED ART DOCUMENT

Patent Document 1 is Japanese Examined Patent Publication (kokoku) No. H07-77988 (pages 1-3, FIG. 1).

BRIEF SUMMARY OF THE INVENTION

The present invention has been made to solve the above-described problems, and an object of the present invention is to provide a wiring substrate in which the size and the total number of elements to be mounted later are less likely to be restricted by the surface of a metallic heatsink inserted into a through hole penetrating between the front surface and the rear surface of the substrate body made from ceramic, and cracks and the like are less likely to occur in the vicinity of the joining part of the ceramic of the substrate body when the heatsink is brazed.

The present invention includes a step portion provided on an inner wall surface, of a substrate body made from ceramic, which forms a through hole penetrating between a front surface and a rear surface of the substrate body. The step portion faces a flange provided so as to protrude outward from an entire peripheral side surface of a heatsink inserted into the through hole, and brazing is performed between the step portion and the flange.

That is, a wiring substrate of the present invention includes: a substrate body made from ceramic, having a front surface and a rear surface, and having (i.e., defining) a through hole penetrating between the front surface and the rear surface; and a heatsink inserted into (i.e., positioned in) the through hole of the substrate body. The substrate body includes a step portion protruding in a direction perpendicular to an axial direction of the through hole or a step portion inclined such that the step portion on a center side is closer to the rear surface than that on a peripheral side in a plan view. The step portion is formed over an entire periphery on an inner wall surface forming the through hole of the substrate body. The heatsink has a periphery and includes a flange protruding outward from the periphery, the flange having a joining surface facing the step portion. In other words, the flange facing the step portion is provided so as to protrude, over an entire periphery on a side surface of the heatsink. A stress relaxing ring is arranged over an entire periphery between the step portion and the joining surface of the flange. A brazing material is provided at least between the stress relaxing ring and the joining surface of the flange and between the stress relaxing ring and the step portion.

According to the above, the substrate body and the heatsink are joined by brazing between the step portion of the substrate body forming the through hole and the flange provided so as to protrude from an entire peripheral side surface of the heatsink and to face the step portion. Thus, the invention provides the following effects (1) to (3).

(1) The front surface of the heatsink can be used as a mounting area for an element to be mounted later. That is, the mounting area for an element to be mounted later is less likely to be restricted by the size of the through hole provided in the substrate body. Therefore, it becomes possible to comparatively freely select the size of the element or to reduce restriction of the total number of the elements.

(2) Shrinkage stress occurring in the heatsink due to thermal shrinkage after the brazing is transmitted, via only the comparatively thin flange protruding from the entire peripheral side surface of the heatsink, to the ceramic of the substrate body forming the adjacent step portion. Therefore, cracking and peeling are less likely to occur in the vicinity of the joining part of the brazed ceramic.

(3) A part of shrinkage stress occurring in the heatsink due to thermal shrinkage after the brazing is absorbed by the stress relaxing ring. Therefore, cracking and peeling are further less likely to occur in the vicinity of the joining part, and thus the effect (2) can be further remarkably provided.

The ceramic is a high-temperature fired ceramic such as alumina, mullite, or aluminum nitride, or a low-temperature fired ceramic such as glass-ceramic.

The substrate body may be formed from a single ceramic layer, or may be formed from a plurality of stacked ceramic layers. In the case of using the single ceramic layer, pads are formed on the front surface thereof, connection terminals are formed on the rear surface thereof, and via conductors electrically connecting the pads and the connection terminals are formed along the thickness direction of the substrate body. In the case of stacking the plurality of ceramic layers, in addition to the pads, the connection terminals, and the via conductors, wiring layers are further formed among the ceramic layers.

The heatsink is formed from, for example, W—Cu-based alloy or Mo—Cu-based alloy.

The rear surface of the heatsink may be positioned outward of the rear surface of the substrate body. That is, the rear surface of the heatsink may protrude out of the substrate body. Such a configuration makes it easy to bring the rear surface of the heatsink into contact with another member (e.g., motherboard), and thus heat dissipation is easily ensured. In the rear surface of the heatsink, a plurality of female thread holes may be formed which are used for fixing the wiring substrate to a motherboard such as a printed board on which the wiring substrate is to be mounted.

The term "face" means that the joining surface of the flange is almost parallel to the step portion with a gap therebetween.

The "step portion" includes, as well as a case where the step portion is perpendicular to the axial direction, a case where the step portion is inclined such that the step portion on the center side is closer to the rear surface of the substrate body than that on the outer peripheral side in a side (sectional) view with respect to the axial direction.

The brazing material is formed from, for example, silver solder (Ag—Cu-based alloy), and is, for example, a preformed material formed in advance in a rectangular frame shape or an annular shape in a plan view.

The stress relaxing ring is formed from pure copper, copper alloy, or the like, and is, for example, formed in advance in a ring shape (a rectangular frame shape, a frame shape exhibiting a regular polygonal shape with five or more sides, an annular shape, or the like) in a plan view by performing etching work or the like on a flat plate of pure copper, copper alloy, or the like.

On the front surface of the heatsink, an element having a comparatively great heat generation amount, such as a semiconductor element, a photoelectric conversion element, or an LED element, is to be mounted later.

In addition, the present invention may also include a wiring substrate in which the heatsink is designed such that the front surface of the flange opposite to the joining surface on which the brazing material is provided is flush with the front surface of the heatsink.

In this case, it is possible to mount elements on the entire front surface of the heatsink including the front surface opposite to the joining surface of the flange on which the brazing material is provided. Thus, remarkably, the embodiment further provides effect (1).

In addition, the present invention also includes a wiring substrate wherein the stress relaxing ring is arranged in an entirety of an overlapping area where the joining surface of the flange of the heatsink and the step portion of the substrate body overlap each other in a plan view, or either on an outer peripheral side or an inner peripheral side in the overlapping area.

Among the above configurations, the configuration in which the stress relaxing ring is arranged in the entire overlapping area in a plan view provides the effects (1) to (3) and enables the substrate body and the heatsink to be strongly joined.

In addition, the configuration in which the stress relaxing ring is arranged on the outer peripheral side in the overlapping area provides the effects (1) to (3) and enables further accurate setting of the position at which the stress relaxing ring should be arranged in the through hole, in manufacturing (effect (4)).

Further, the configuration in which the stress relaxing ring is arranged on the inner peripheral side in the overlapping area provides the effects (1) to (3) and makes it possible to easily perform examination of a gold coat or the like coating the surface of the brazing material as described later, visually from the rear surface sides of the substrate body and the heatsink, in manufacturing (effect (5)).

In addition, in the configuration in which the stress relaxing ring is arranged on the inner peripheral side in the overlapping area, a space surrounded between the brazing material on the inner peripheral side of the stress relaxing ring and the step portion is less likely to occur. Therefore, when the gold coat is formed by electroplating, occurrence of a pool of the plating liquid is prevented, and thus it becomes easy to form a proper gold coat and the like (the effect (6)).

Further, the present invention also includes a wiring substrate wherein the brazing material is provided between an inner peripheral side of the stress relaxing ring and an inner peripheral side of the joining surface of the flange of the heatsink in a plan view, and externally exposed surfaces of the brazing material and the heatsink are coated with at least a gold coat.

According to the above, it is possible to prevent externally exposed surfaces of the brazing material and the heatsink from being inadvertently corroded (effect (7)).

As a ground under the gold coat, a nickel coat is formed in advance.

In addition, a nickel coat is formed in advance on the entire surface of the stress relaxing ring, thereby preventing contact with silver solder composing the brazing material and preventing the silver from being inadvertently melted and dispersed when the silver solder is heated.

In addition, the present invention also includes a wiring substrate wherein the through hole of the substrate body has a rectangular shape in a plan view, the step portion is formed such that widths thereof at a long side and a short side of the through hole are different from each other, and widths of a long side and a short side of the stress relaxing ring provided at the step portion and having a rectangular shape in a plan view are also different in the same relationship as in the step portion.

According to the above, for example, in the case where the step portion has a rectangular frame shape in a plan view, and the width of a pair of opposed short sides of the step portion is greater and the width of a pair of opposed long sides of the step portion is smaller, in accordance with the magnitude relationship of these widths, the stress relaxing ring having a rectangular frame shape in a plan view is formed with a pair of short sides having a greater width and a pair of long sides having a smaller width. As a result, the embodiment reliably provides effect (2) even in the case where the wiring substrate has a through hole having two types of step portions with different widths as described above.

Further, the present invention also includes a wiring substrate wherein, in a cross section along a vertical direction perpendicular to a plane direction along the front surface of the substrate body, a length in the plane direction of the stress relaxing ring is shorter than a length in the vertical direction of the stress relaxing ring.

According to the above, in a cross section along the vertical direction between the step portion and the joining surface, the stress relaxing ring having a vertically elongated cross section is provided via the brazing material. Therefore, stress due to a thermal expansion difference between the substrate body and the heatsink is absorbed by deformation of the stress relaxing ring itself, and thus crack and peeling are less likely to occur in the vicinity of the joining part of the brazed ceramic (effect (8)).

In addition, the present invention also includes a wiring substrate wherein, on an outer periphery of the stress relaxing ring, a plurality of protrusions are formed so as to protrude toward an inner wall surface forming the through hole of the substrate body.

According to the above, in a cross section in a plane direction along the front surface of the substrate body, the gap between the outer periphery of the stress relaxing ring and the inner wall surface of the substrate body forming the through hole can be narrowed as much as possible. Thus, the embodiment remarkably provides effect (4). In addition, as for the part of the stress relaxing ring other than the part where the protrusions are formed, in a cross section along a vertical direction perpendicular to a plane direction along the front surface of the substrate body, the length in the plane direction of the stress relaxing ring can be made shorter than the length in the vertical direction of the stress relaxing ring. Thus, the embodiment also provides effect (8).

In addition, the present invention also includes a wiring substrate wherein a rear surface of the heatsink protrudes outward of the rear surface of the substrate body.

According to the above, in the heatsink, the rear surface of the heatsink can be easily brought into contact with another member (e.g., motherboard), and thus heat transmitted from the front surface side to the rear surface side of the substrate body can be easily dissipated from the rear surface side of the substrate body to the outside (effect (9)).

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Hereinafter, modes for carrying out the present invention will be described.

Figure 1A:
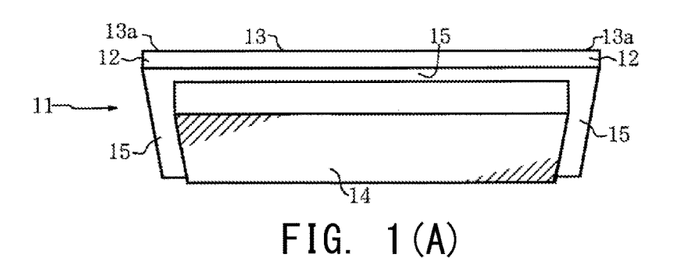
FIG. 1(A) is a perspective view of a heatsink used for a wiring substrate of the present invention as seen from the rear surface side thereof.
Figure 1B:
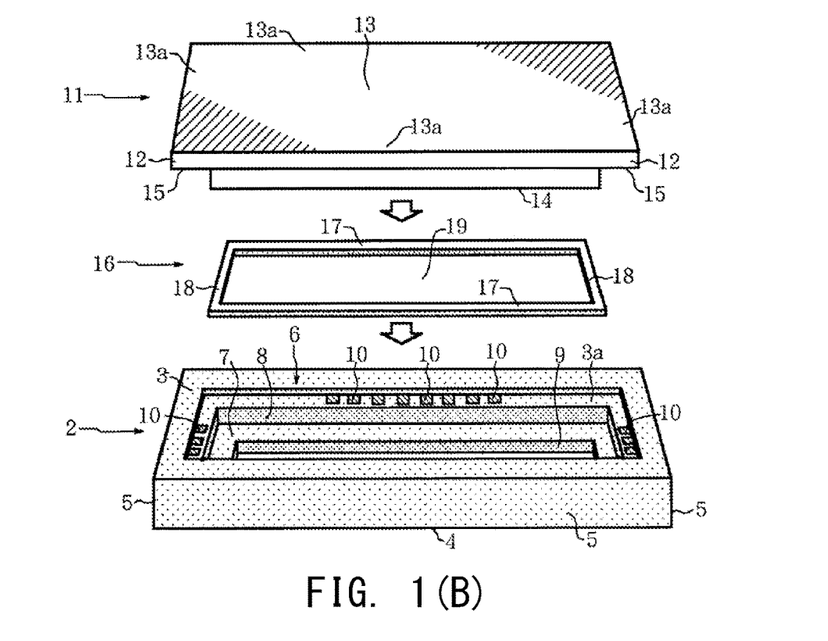
FIG. 1(B) is an exploded perspective view of the heatsink, a stress relaxing ring, and a substrate body as seen from the front surface sides thereof.

FIG. 1(A) is a perspective view of a heatsink 11 used for a wiring substrate 1 of the present invention as seen from the rear surface 14 side thereof. FIG. 1(B) is an exploded perspective view of the heatsink 11, a stress relaxing ring 16, and a substrate body 2 as seen from the front surface 3, 13 sides thereof.

As shown in FIGS. 1(A) and 1(B), the heatsink 11 has: a front surface 13 and a rear surface 14 each having a rectangular shape in a plan view; and a flange 12 protruding horizontally outward from the four sides of the front surface 13 and having a rectangular frame shape in a plan view. A front surface 13a of the flange 12 is flush with the front surface 13, and the surface thereof opposite (rear surface 14 side) to the front surface 13a is a joining surface 15 to be used for brazing as described later. The heatsink 11 is formed from, for example, W-10 wt % Cu alloy or Mo-30 wt % Cu alloy.

As shown at the lower part in FIG. 1(B), the substrate body 2 has: a front surface 3 and a rear surface 4 each having a rectangular outer shape in a plan view; and a through hole 6 which is provided therebetween and has a rectangular shape in a plan view and into which the heatsink 11 is inserted. The substrate body 2 has a step portion 7 formed between an inner wall surface 8 on the front surface 3 side and an inner wall surface 9 on the rear surface 4 side of the substrate body 2. The step portion 7 defines a part of the through hole 6. The step portion 7 protrudes toward the center of the substrate body 2 in a direction perpendicular to the axial direction of the through hole 6, and has a rectangular frame shape in a plan view. Between the front surface 3 and the inner wall surface 8, a shallow step portion 3a is formed which is included as a part of the front surface 3 and has a rectangular frame shape in a plan view. A plurality of pads 10 are formed in the vicinity of the center on each of the four sides of the step portion 3a. The substrate body 2 is formed from ceramic including a plurality of ceramic layers integrally stacked as described later.

As shown at the middle in FIG. 1(B), the stress relaxing ring 16 having a rectangular frame shape in a plan view is provided between the joining surface 15 of the flange 12 of the heatsink 11 and the step portion 7 of the through hole 6 of the substrate body 2. The stress relaxing ring 16 is formed of, for example, pure copper (electrolytic copper) or copper alloy, and has a pair of long sides 17 opposed to each other in a plan view, a pair of short sides 18 opposed to each other in a plan view, and a space 19 surrounded by these sides and having a rectangular shape in a plan view. The cross sections of the long sides 17 and the short sides 18 all have rectangular shapes or square shapes. The space 19 is slightly larger than a body part of the heatsink 11 excluding the flange 12 in a plan view. A nickel coat (26) described later is formed on (coats) the entire surface of the stress relaxing ring 16 in advance.

The wiring substrate 1 is assembled as follows. A sheet-like brazing material (27) described later which is preformed into a rectangular frame shape in a plan view is applied to the top surface and the bottom surface of the stress relaxing ring 16 in advance, and as shown by a void arrow in FIG. 1(B), the resultant stress relaxing ring 16 is placed on the step portion 7 of the substrate body 2. Thereafter, the heatsink 11 is inserted, with the rear surface 14 side thereof directed downward, into the through hole 6 from the front surface 3 side of the substrate body 2. At this time, the brazing material (27) on the lower-layer side, the stress relaxing ring 16, the brazing material (27) on the upper-layer side, and then the flange 12 of the heatsink 11 are stacked in this order on the step portion 7. In this state, the substrate body 2 including the heatsink 11, the stress relaxing ring 16, and the brazing material (27) is heated to melt the brazing material (27). Further, the heatsink 11 and the substrate body 2 which are brazed with the stress relaxing ring 16 therebetween are immersed into a nickel plating bath and then a gold plating bath, whereby externally exposed surfaces of conductors such as the pads 10, the heatsink 11, and the brazing material (27) are electroplated with nickel and then gold.

Figure 1C:
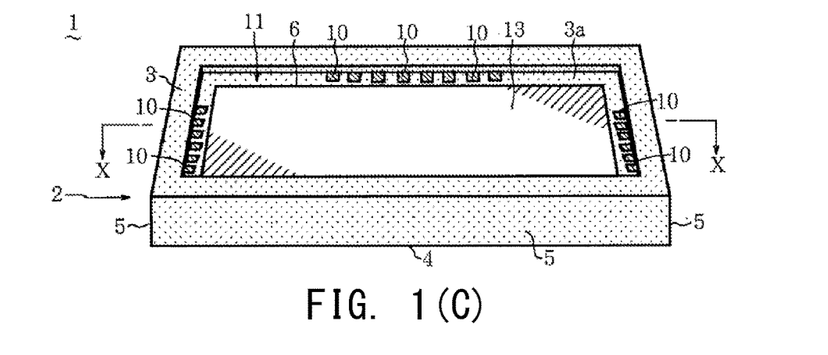
FIG. 1(C) is a perspective view showing the wiring substrate of the present invention.
Figure 2:
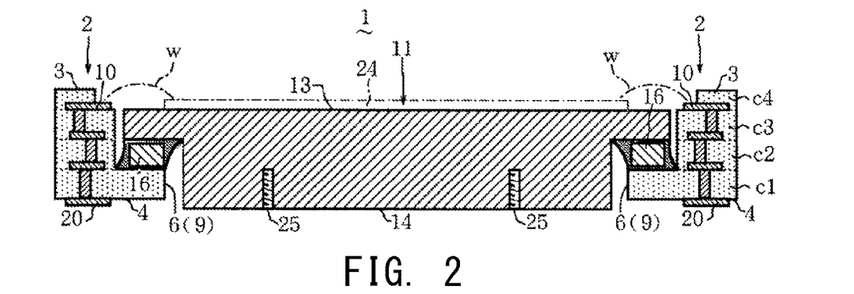
FIG. 2 is a vertical sectional view as seen from an X-X arrow direction in FIG. 1(C).
Figure 3:
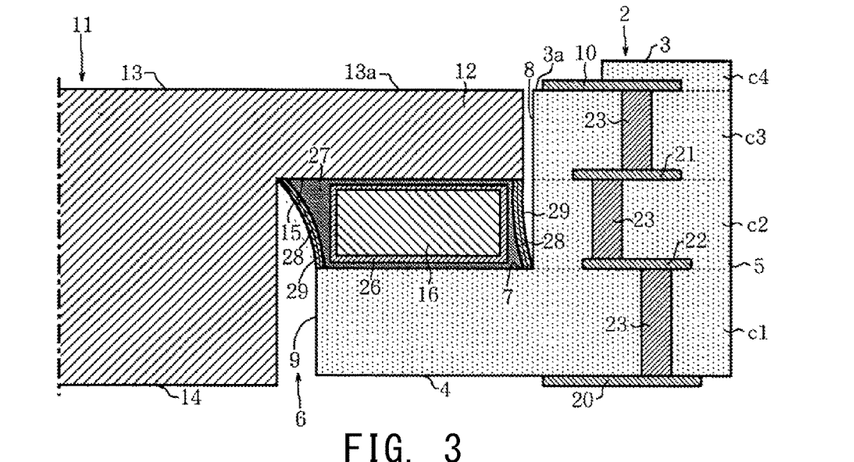
FIG. 3 is a partial vertical sectional view showing a joining part formed by brazing in the wiring substrate.

As a result, as shown in FIG. 1(C), the vertical sectional view in FIG. 2, and the enlarged vertical sectional view in FIG. 3, the wiring substrate 1 is obtained in which, in the through hole 6 of the substrate body 2, the rear surface 14 of the heatsink 11 passes through the inner wall surfaces 8 and 9 of the substrate body 2 forming the through hole 6 and slightly protrudes outward (in the drawings, downward) of the rear surface 4 of the substrate body 2, and the joining surface 15 of the flange 12 of the heatsink 11 is joined above the step portion 7 via the brazing material 27 having roughly a parallelogram vertical cross section and the stress relaxing ring 16 surrounded by the brazing material 27.

As shown in FIG. 2 and FIG. 3, the substrate body 2 is formed by, for example, integrally stacking ceramic layers c1 to c4 mainly composed of alumina. Among the ceramic layers c1 to c4, wiring portions of the pads 10 and wiring layers 21 and 22 are individually formed, and a plurality of connection terminals 20 are formed on the rear surface 4 of the substrate body 2. The wiring portions of the pads 10, the wiring layers 21 and 22, and the connection terminals 20 are electrically connected with each other through via conductors 23 which individually penetrate through the ceramic layers c1 to c4.

The pads 10, the connection terminals 20, the wiring layers 21 and 22, and the via conductors 23 are mainly formed from tungsten (W) or molybdenum (Mo). The substrate body 2 is manufactured in advance by a known method (punching work on a green sheet, a process for filling and printing of a conductive paste, and a process for stacking and firing a plurality of green sheets).

As shown in FIG. 2, a plurality of female thread holes 25 for screwing and fixing the wiring substrate 1 to a motherboard such as a printed board (not shown) are formed in the rear surface 14 of the heatsink 11. On the front surface 13 of the heatsink 11, a photoelectric conversion element 24 having a flat shape is mounted later, and the element 24 is electrically connected with the pads 10 via a bonding wire w. A cover plate (not shown) for sealing the element 24 from outside is attached above the element 24.

As shown in FIG. 3, since the entire surface of the stress relaxing ring 16 is coated with the nickel coat 26, the copper component of the ring 16 is prevented from contacting the silver component of the brazing material 27 to cause corrosion. A gold coat 29 having a desired thickness is formed over an externally exposed surface of the brazing material 27 with a nickel coat 28 therebetween. The nickel coat 28 and the gold coat 29 are similarly formed also on externally exposed surfaces of the pads 10, the heatsink 11, and the connection terminals 20.

As shown in FIG. 3, the stress relaxing ring 16 is arranged in almost the entire area where the joining surface 15 of the flange 12 of the heatsink 11 and the step portion 7 forming the through hole 6 of the substrate body 2 overlap each other in a plan view.

Figure 4:
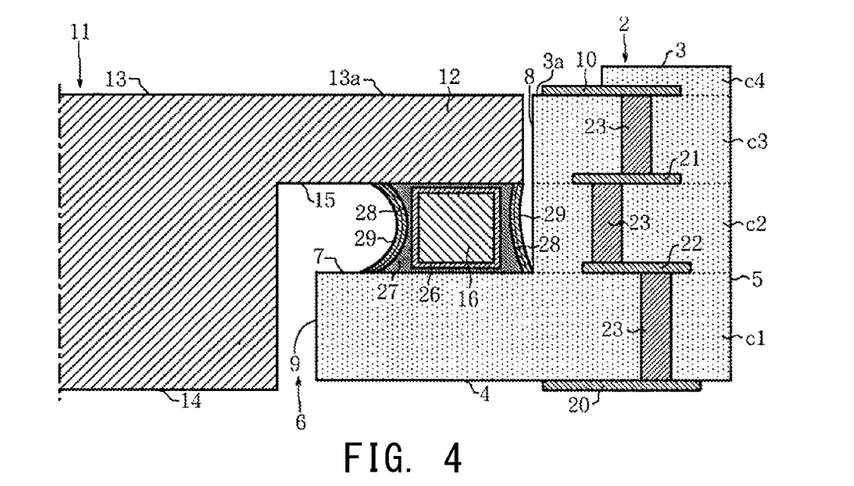
FIG. 4 is a partial vertical sectional view showing the joining part formed by brazing according to another embodiment.

Without limitation to the above embodiment, as shown in the enlarged vertical sectional view in FIG. 4, a stress relaxing ring 16 having a small width in the vertical cross section thereof and having a rectangular shape may be arranged on the outer peripheral side in the area where the joining surface 15 of the flange 12 of the heatsink 11 and the step portion 7 of the through hole 6 of the substrate body 2 overlap each other in a plan view.

Figure 5:
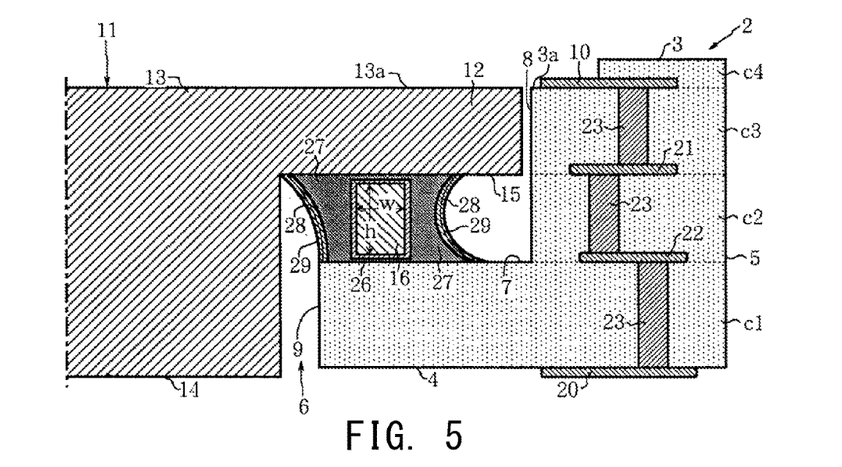
FIG. 5 is a partial vertical sectional view showing the joining part formed by brazing according to still another embodiment.

As shown in an enlarged vertical sectional view in FIG. 5, a stress relaxing ring 16 in which a width (length) w in a plane direction parallel with the front surface 3 of the substrate body 2 is smaller than a height (length) h in a direction perpendicular to the plane direction, may be arranged on the inner peripheral side in the area where the joining surface 15 of the flange 12 of the heatsink 11 and the step portion 7 forming the through hole 6 of the substrate body 2 overlap each other in a plan view. According to this embodiment, the stress relaxing ring 16 can be freely arranged at an arbitrary position between the step portion 7 and the joining surface 15.

Figure 6:
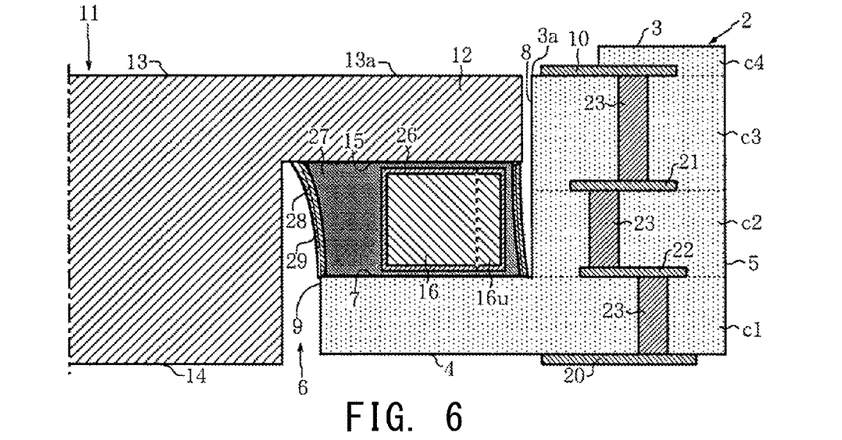
FIG. 6 is a partial vertical sectional view showing the joining part using a stress relaxing ring according to another embodiment.
Figure 7A:
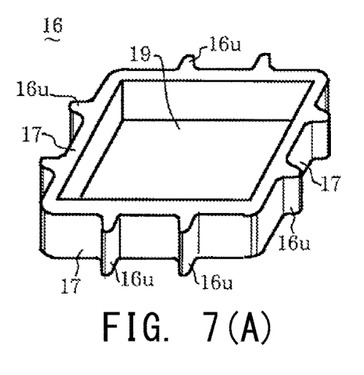
FIG. 7(A) is a perspective view showing the stress relaxing ring in FIG. 6.
Figure 7B:
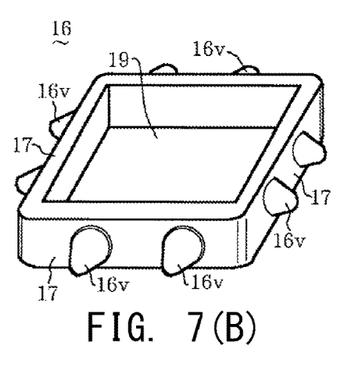
FIG. 7(B) is a perspective view showing a stress relaxing ring according to still another embodiment.

As shown in a partial enlarged sectional view in FIG. 6, a stress relaxing ring 16 having a pair (plurality) of protrusions 16u directed outward and provided on the outer periphery of each of the four sides 17 having a square shape in a plan view may be provided between the step portion 7 forming the through hole 6 of the substrate body 2 and the joining surface 15 of the flange 12 of the heatsink 11, and the brazing material 27 may be provided so as to surround the entirety of the stress relaxing ring 16. As shown in FIG. 7(A), the stress relaxing ring 16 has the pair of protrusions 16u provided on the outer periphery of each of the four sides 17 and protruding along the vertical direction, and is obtained by performing etching work or punching work on a material such as the electrolytic copper. As shown in FIG. 7(B), a pair of conical protrusions 16v having a conical shape may be provided so as to protrude on the outer periphery of each of the four sides 17. Such a stress relaxing ring 16 having the protrusions 16v is manufactured by, for example, precise casting of the material.

Figure 8:
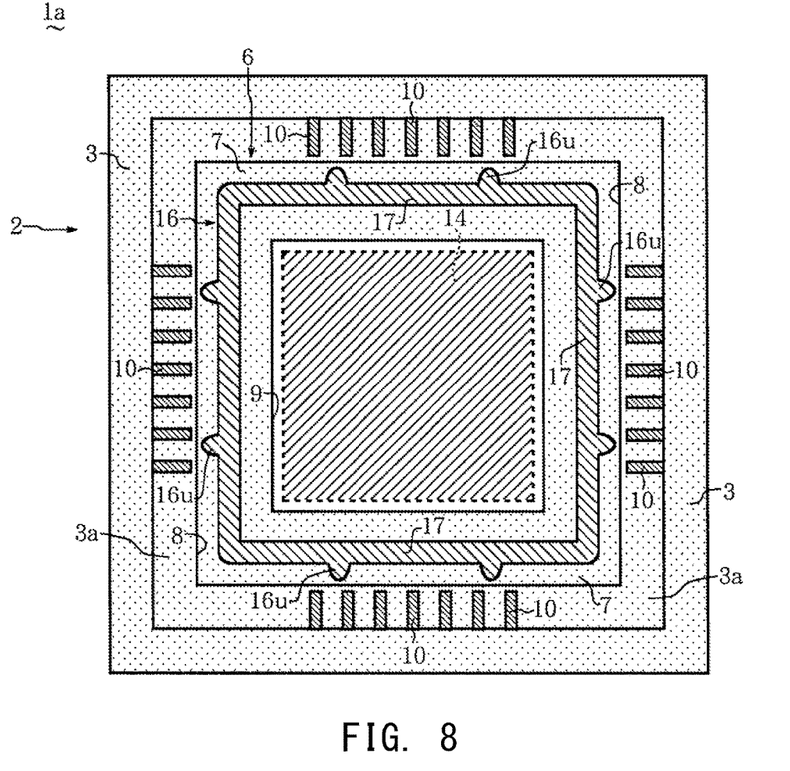
FIG. 8 is a horizontal sectional view showing the wiring substrate using the stress relaxing ring shown in FIGS. 6 and 7(A).

As shown in a horizontal sectional view in FIG. 8, when the stress relaxing ring 16 shown in FIGS. 6 and 7(A) is inserted into the through hole 6 of the substrate body 2 having the front surface 3 and the rear surface 4 that have square shapes in a plan view, the tip ends of the pair of protrusions 16u provided so as to protrude on the outer periphery of each side 17 of the stress relaxing ring 16 become close to the inner wall surface 8 of the substrate body 2 forming the through hole 6. As a result, it becomes possible to accurately arrange the stress relaxing ring 16 on the inner wall surface 8 side between the step portion 7 and the joining surface.

The protrusions 16u of the stress relaxing ring 16 may be provided so as to protrude only on the upper surface side or the lower surface side of each side 17.

The wiring substrate 1 including each embodiment as described above provides at least effects (1) to (3) and (7). In addition, the embodiment shown in FIG. 4, further provides effect (4). In addition, the configuration in which the rear surface 14 of the heatsink 11 protrudes outward of the rear surface 4 of the substrate body 2 as shown in FIGS. 3 to 6 provides effect (9).

Further, in the embodiment shown in FIG. 5, the effects (5) and (8) can be further provided. In addition, in this embodiment, there is no space surrounded by the brazing material 27 on the inner peripheral side of the stress relaxing ring 16, the heatsink 11, and the step portion 7, and when the gold coat 29 is formed by electroplating, occurrence of a pool of the plating liquid is prevented. Thus, it is possible to reliably form a proper gold coat 29 (effect (6)).

In addition, the embodiments shown in FIGS. 6 to 8 also provide effects (1) to (9).

As shown in FIGS. 6 to 8, the front surfaces 3 and 13 and the rear surfaces 4 and 14 of the substrate body 2 and the heatsink 11 may have rectangular shapes in a plan view.

Instead of the flat-plate-shaped connection terminals 20 provided on the rear surface 4 of the substrate body 2, connection terminals formed from conductor pins having thin elongated rod shapes may be used.

The long side and the short side of the step portion 7 of the substrate body 2 may have widths different from each other in a plan view. In this embodiment, the long side 17 and the short side 18 of the stress relaxing ring 16 are also designed to have different widths corresponding to the respective widths of the step portion 7.

Figure 9:
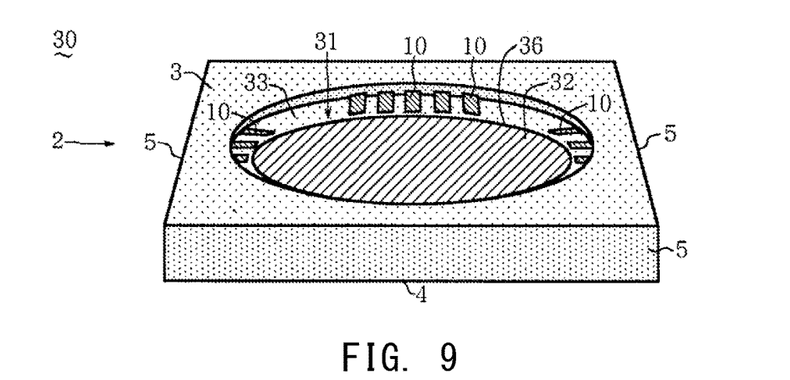
FIG. 9 is a perspective view showing a wiring substrate according to another embodiment.

FIG. 9 is a perspective view showing a wiring substrate 30 according to an embodiment different from the embodiment of the wiring substrate 1.

As shown in FIG. 9, in the wiring substrate 30, a through hole 36 having a circular shape in a plan view penetrates between the front surface 3 and the rear surface 4 of the same substrate body 2 as described above, and a step portion (not shown) having an annular shape in a plan view is formed on the inner wall surface of the substrate body 2. A shallow step portion 33 having an annular shape in a plan view is located between the front surface 3 of the substrate body 2 and the inner wall surface of the substrate body 2, and the same plurality of pads 10 as described above are formed at appropriate locations on the step portion 33.

A heatsink 31 having a circular shape in a plan view is inserted in the same manner as described above into the through hole 36, and the brazing material 27 is provided between a flange 32 and the step portion via the stress relaxing ring 16 according to each embodiment shown in FIGS. 3 to 8, whereby the substrate body 2 and the heatsink 31 are joined with each other.

The wiring substrate 30 as described above also can provide the same effects (1) to (9) as in the above joining configurations of the wiring substrate 1, according to the respective embodiments.

The through hole 36, the heatsink 31, and the like may have elliptic shapes or oblong shapes in a plan view.

Figure 10:
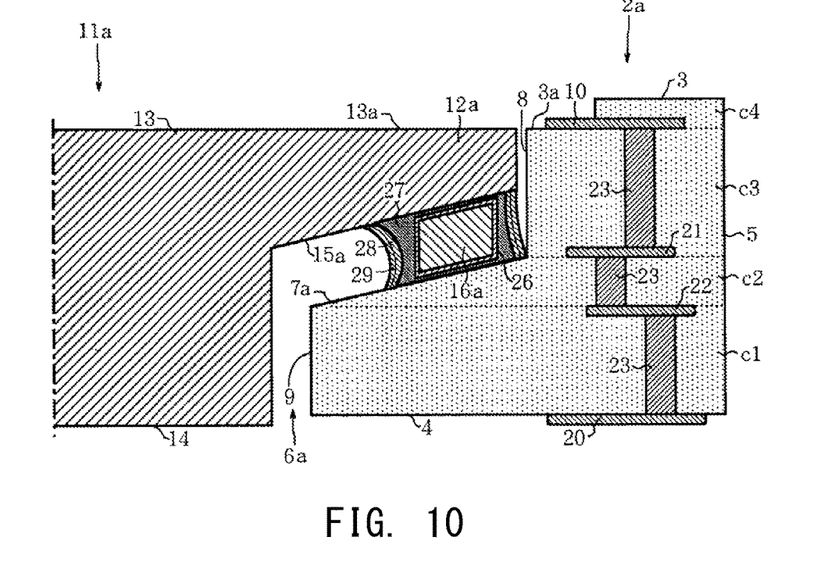
FIG. 10 is a partial vertical sectional view showing a vicinity of a joining part according to another embodiment.

FIG. 10 is the same partial enlarged sectional view as in the above, showing the vicinity of the joining part using a substrate body 2a, a heatsink 11a, and a stress relaxing ring 16a according to another embodiment different from the above embodiments, in the wiring substrate 1, 30.

As shown in FIG. 10, the substrate body 2a has a through hole 6a penetrating between the same front surface 3 and rear surface 4 as described above, and a step portion 7a is formed between the inner peripheral surfaces 8 and 9 so as to be inclined such that the step portion 7a on the center side is closer to the rear surface 4 than that on the outer peripheral side in a plan view. The step portion 7a is formed along a direction slightly inclined from a direction perpendicular to the axial direction of the through hole 6a, and protrudes toward the center side of the substrate body 2a.

For forming the step portion 7a, for example, the following method is used. A green sheet that will become a ceramic layer c2 later is punched to form a through hole having a rectangular shape or a circular shape in a plan view, and then a quadrangular-pyramid-shaped punch formed such that four sides of the tip end surface are inclined or a conical punch formed such that the peripheral edge of the tip end surface is inclined, is pressed to the peripheral edge of the through hole, thereby causing plastic deformation.

As shown in FIG. 10, the heatsink 11a has the same front surface 13 and rear surface 14 as described above, and has, on the outer peripheral side of the front surface 13, a flange 12a extending outward and having: a front surface 13a flush with the front surface 13; and a joining surface 15a facing the step portion 7a of the substrate body 2 and inclined so as to be parallel with the step portion 7a.

As shown in FIG. 10, on the outer peripheral side of the area where the step portion 7a of the substrate body 2a and the joining surface 15a of the flange 12a overlap each other in a plan view, the same brazing material 27 as described above is provided so as to surround a stress relaxing ring 16a the vertical cross section of which has upper and lower sides almost parallel with each other and has a parallelogram shape as a whole. The same nickel coat 28 and gold coat 29 as described above are formed on a pair of inner and outer exposed surfaces of the brazing material 27.

The wiring substrate 1, 30 having the joining part using the substrate body 2a, the heatsink 11a, and the stress relaxing ring 16a as described above enables further suppression of occurrence of crack and peeling in the vicinity of the outer peripheral end (base end) of the step portion 7a of the substrate body 2a against stress occurring when the heatsink 11a thermally shrinks after brazing, whereby the effect (2) can be further provided.

The stress relaxing ring 16a may be arranged in almost the entire area where the step portion 7a of the substrate body 2 and the joining surface 15a of the flange 12a overlap each other in a plan view, or may be arranged on the inner peripheral side of the overlapping area.

The plurality of protrusions 16u, 16v may be provided so as to protrude on the outer periphery of the stress relaxing ring 16a.

Without being limited to a single inclined surface, the joining surface 15a may be formed from a plurality of inclined surfaces contiguous to each other, or may be a mild curved surface the vertical cross section of which has an upward convex shape.

Figure 11:
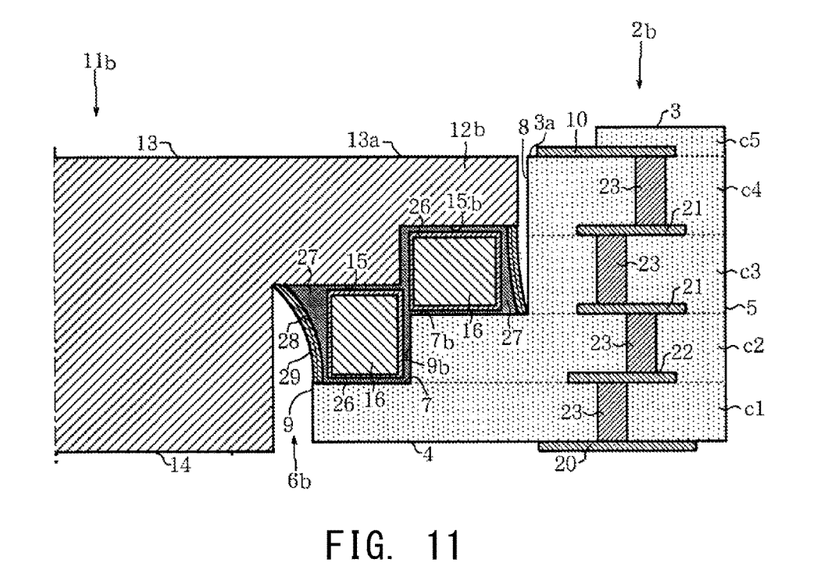
FIG. 11 is a partial vertical sectional view showing a vicinity of a joining part according to an application embodiment of the joining part.

FIG. 11 is the same partial enlarged vertical sectional view as in the above, showing the vicinity of the joining part using a substrate body 2b and a heatsink 11b according to still another embodiment different from the above embodiments, in the wiring substrate 1, 30.

As shown in FIG. 11, the substrate body 2b has a through hole 6b penetrating between the same front surface 3 and rear surface 4 as described above, and the through hole 6b has three inner wall surfaces 8, 9b, and 9 having different widths (inner diameters), along the axial direction, and has two inner and outer (upper and lower) step portions 7 and 7b among these inner wall surfaces. For forming the step portions 7 and 7b, the substrate body 2b is formed by stacking five ceramic layers c1 to c5 in which through holes having widths or inner diameters different from each other are formed by punching green sheets.

As shown in FIG. 11, the heatsink 11b has the same front surface 13 and rear surface 14 as described above, and has, on the outer peripheral side of the front surface 13, a flange 12b extending outward and having: a front surface 13a flush with the front surface 13; and a pair of upper and lower joining surfaces 15 and 15b respectively facing the step portions 7 and 7b of the substrate body 2 and being parallel with the step portions 7 and 7b.

As shown in FIG. 11, between the step portions 7 and 7b of the substrate body 2b and the joining surfaces 15 and 15b of the heatsink 11b, the same brazing material 27 as described above is provided so as to have a different-shape cross section (square spectacles shape or stepped double rectangular shape) and to individually surround two stress relaxing rings 16 having slightly smaller sectional areas than those described above, and having rectangular shapes. The same nickel coat 28 and gold coat 29 as described above are formed on a pair of inner and outer exposed surfaces of the brazing material 27.

The wiring substrate 1, 30 having the joining part using the substrate body 2b, the heatsink 11b, and the two stress relaxing rings 16 as described above enables, owing to the two stress relaxing rings 16, further reduction in stress occurring when the heatsink 11b thermally shrinks after brazing. As a result, it becomes possible to further suppress occurrence of crack and peeling on the ceramic in the vicinity of the step portions 7 and 7b and the inner wall surface 9b, of the substrate body 2b, which are joined with the brazing material 27, whereby the effect (2) can be further provided.

The step portions 7 and 7b and the joining surfaces 15 and 15b of the flange 12b of the heatsink 11b may be inclined surfaces as shown in FIG. 10.

The number of step portions 7n and the number of joining surfaces 15n of the flange 12b of the heatsink 11b may be the same number that is equal to or greater than 3.

The two stress relaxing rings 16 may be contiguously connected in a stepped manner so as to be an integrated body, or a plurality of the protrusions 16u, 16v may be provided so as to protrude on each of the outer peripheries of the two stress relaxing rings 16.

The present invention is not limited to the embodiments described above.

For example, the ceramic forming the substrate body 2, 2a, 2b may be high-temperature fired ceramic such as mullite or aluminum nitride, or low-temperature fired ceramic such as glass-ceramic. In the latter case, silver or copper is applied as the conductors such as the pads 10, the connection terminals 20, the wiring layers 21 and 22, and the via conductors 23.

The through hole penetrating between the front surface 3 and the rear surface 4 of the substrate body 2 or the like may have a regular polygonal shape or a deformed polygonal shape with five or more sides in a plan view. The step portion formed on the inner wall surface in this case has a regular polygonal frame shape or a deformed polygonal frame shape with five or more sides in a plan view.

The front surface 3 of the substrate body 2 or the like may be positioned higher in the thickness direction than the opening part of the through hole 6 or the like, and a cavity that opens at the front surface 3 may be formed above the front surface 13 of the heatsink 11 or the like inserted into the through hole 6 or the like.

The pads 10 may be directly formed on the front surface 3 of the substrate body 2 or the like.

The substrate body 2 or the like may have a plurality of the through holes 6 or the like penetrating between the front surface 3 and the rear surface 4, the heatsinks 11 or the like may be inserted into the respective through holes 6 or the like, and brazing with the heatsinks 11 or the like may be performed via the stress relaxing ring 16 or the like or may be directly performed by only the brazing material 27.

The present invention makes it possible to reliably provide a wiring substrate in which the size and the total number of elements to be mounted later are less likely to be restricted by the surface of a metallic heatsink inserted into a through hole penetrating between the front surface and the rear surface of the substrate body made from ceramic, and crack and peeling are less likely to occur in the ceramic part of the substrate body when the heatsink is brazed.

DESCRIPTION OF REFERENCE NUMERALS 1, 30: wiring substrate
2, 2a, 2b: substrate body
3: front surface
4: rear surface
6, 6a, 6b, 36: through hole
7, 7a, 7b: step portion
8, 9, 9b: inner wall surface
11, 11a, 11b, 31: heatsink
12, 12a, 12b, 32: flange
15, 15a, 15b: joining surface
16, 16a: stress relaxing ring
16u, 16v: protrusion
27: brazing material
c1 to c5: ceramic layer (ceramic)
h: height (length) of cross section of stress relaxing ring
w: width (length) of cross section of stress relaxing ring

What is claimed is:

1. A wiring substrate comprising:
a substrate body composed of ceramic, having a front surface and a rear surface, defining a through hole between the front surface and the rear surface, and including a step portion over an entire periphery on an inner wall surface facing the through hole; and
a heatsink positioned in the through hole, having a periphery, and including a flange protruding outward from the periphery, the flange having a joining surface facing the step portion,
a stress relaxing ring between the step portion and the joining surface of the flange, the stress relaxing ring arranged on an inner peripheral side of an overlapping area where the joining surface of the flange of the heatsink and the step portion of the substrate body overlap each other in a plan view, and
a brazing material between the stress relaxing ring and the joining surface of the flange and between the stress relaxing ring and the step portion.

2. The wiring substrate according to claim 1, wherein
the brazing material is provided between an inner peripheral side of the stress relaxing ring and an inner peripheral side of the joining surface of the flange of the heatsink in a plan view, and externally exposed surfaces of the brazing material and the heatsink are coated with at least a gold coat.

3. The wiring substrate according to claim 1, wherein
the through hole of the substrate body has a rectangular shape in a plan view,
the step portion is formed such that widths thereof at a long side and a short side of the through hole are different from each other, and
widths of a long side and a short side of the stress relaxing ring arranged at the step portion and having a rectangular shape in a plan view are also different in the same relationship as in the step portion.

4. The wiring substrate according to claim 1, wherein
in a cross section along a vertical direction perpendicular to a plane direction along the front surface of the substrate body, a length in the plane direction of the stress relaxing ring is shorter than a length in the vertical direction of the stress relaxing ring.

5. The wiring substrate according to claim 1, wherein
on an outer periphery of the stress relaxing ring, a plurality of protrusions are formed so as to protrude toward the inner wall surface facing the through hole.

6. The wiring substrate according to claim 1, wherein
a rear surface of the heatsink protrudes outward of the rear surface of the substrate body.

7. The wiring substrate according to claim 1, wherein
the step portion protrudes in a direction perpendicular to an axial direction of the through hole.

8. The wiring substrate according to claim 1, wherein
the step portion inclines such that the step portion on a center side is closer to the rear surface of the substrate body than that on a peripheral side in a plan view.

\* \* \* \* \*